United States Patent [19]

Eshita et al.

[11] Patent Number: 5,057,880

[45] Date of Patent: Oct. 15, 1991

[54] SEMICONDUCTOR DEVICE HAVING A HETEROEPITAXIAL SUBSTRATE

[75] Inventors: Takashi Eshita, Tokyo; Toshikazu Inoue, Yokohama; Kanetake Takasaki, Tokyo, all of Japan

[73] Assignee: Fujitsu Limited, Kawasaki, Japan

[21] Appl. No.: 601,427

[22] Filed: Oct. 23, 1990

[30] Foreign Application Priority Data

Oct. 23, 1989 [JP] Japan .................................. 1-275350

[51] Int. Cl.⁵ ..................... H01L 29/161; H01L 27/12
[52] U.S. Cl. ............................................ 357/16; 357/4
[58] Field of Search ....................................... 357/16, 4

[56] References Cited

FOREIGN PATENT DOCUMENTS 183498 7/1989 Japan .

Primary Examiner—Mark Prenty
Attorney, Agent, or Firm—Staas & Halsey

[57] ABSTRACT

A semiconductor device comprises a substrate, a compound semiconductor layer provided on the substrate, and an active region formed on the compound semiconductor layer. The substrate in turn comprises a first semiconductor layer of a first semiconductor material, a second semiconductor layer of a second semiconductor material and provided on the first semiconductor layer, and a third semiconductor layer provided on the second semiconductor layer. The third semiconductor layer has a plurality of segments each defined by a pair of side walls that extend substantially perpendicular to the third semiconductor layer. The plurality of segments have a plurality of first-type segments and a plurality of second-type segments wherein the first- and second-type segments are arranged alternately when viewed in a direction parallel to the third semiconductor layer. The first- and second-type segments have respective lattice constants that differ with each other such that a stress field acting substantially perpendicular to the third semiconductor layer is induced in the third semiconductor layer.

12 Claims, 6 Drawing Sheets

F I G. 5
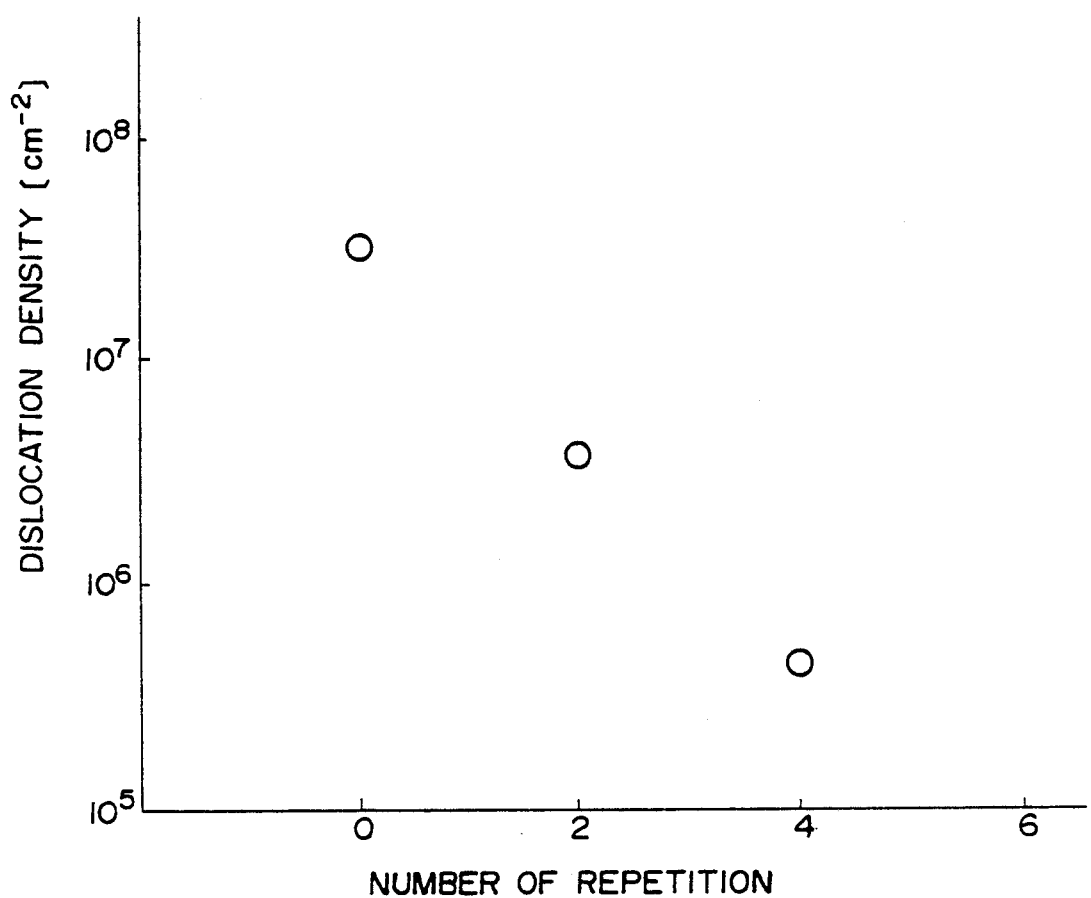

SEMICONDUCTOR DEVICE HAVING A HETEROEPITAXIAL SUBSTRATE

BACKGROUND OF THE INVENTION

1. Field of the Invention

The present invention generally relates to semiconductor devices and more particularly to a semiconductor device having a heteroepitaxially grown substrate provided with a structure for interrupting dislocations.

2. Description of the Related Art

Recently, various semiconductor devices such as laser diodes, light emitting diodes, field effect transistors and the like, are fabricated on a group III-V semiconductor layer that is grown heteroepitaxially on a silicon substrate. Thereby, devices that exploit the advantageous material properties pertinent to the compound semiconductor materials can be constructed on the silicon substrate that is produced by a well established process.

In order to achieve satisfactory device characteristics, the semiconductor layer on which the devices are formed must have an excellent crystallinity, particularly about defects and dislocations. On the other hand, it is known that, because the group III-V compound semiconductor materials generally have lattice constants that differ significantly from those of silicon, the group III-V compound semiconductor materials grown directly on the silicon substrate tend to have the polycrystal phase.

In order to avoid this problem, use of buffer layers has been conventionally employed, wherein a buffer layer is interposed between the silicon substrate and the group III-V compound semiconductor layer for establishing a lattice matching. With the use of suitable buffer layer, one can obtain a single crystal layer of group III-V compound semiconductor layer grown on the silicon substrate. However, such a use of buffer layers increases complexity of fabrication process of semiconductor devices and is thought to be unpractical.

At present, there exist various techniques to grow a single crystal compound semiconductor layer directly on the silicon substrate without using the buffer layer. A typical example of this may be the so-called two-step growth process. The typical example of this process as applied to the case of growing a gallium arsenide (GaAs) layer on a silicon substrate includes the following steps: STEP(1) deposit a layer of GaAs on the silicon substrate at a low temperature as an amorphous phase; and STEP(2) deposit a layer of GaAs on the GaAs layer previously deposited at an increased temperature to form a single crystal GaAs layer that is grown heteroepitaxially on the silicon substrate.

During the latter step, the amorphous GaAs layer deposited previously is crystallized because of the elevated temperature, and the structure obtained after the step 2 has a layered structure substantially consisting of the silicon substrate and a single layer of GaAs. According to this two-step process, the GaAs layer can grown on the silicon substrate as a single crystal layer.

In the foregoing process, however, there arises a problem in that, because of the discrepancy in the lattice constant and thermal expansion between the substrate and the GaAs layer, numerous dislocations are generated at the interface between the substrate and the GaAs layer and such dislocations are propagated toward the surface of the GaAs layer. The generation of the dislocations cannot be eliminated even when the two-step process is employed. Obviously, such dislocations cause deterioration of the device characteristics and should be avoided.

In order to eliminate the problem of dislocations, various structures have been proposed conventionally for interrupting propagation of dislocations. For example, use of a strained superlattice has been proposed as the intervening layer interposed between the silicon substrate and the GaAs layer to interrupt the propagating dislocations.

FIG. 1 shows a conventional structure of compound semiconductor device grown on a silicon substrate 21.

Referring to FIG. 1, a GaAs layer 22 is provided on the silicon substrate 21 by the previously described two-step process. For example, the layer 22 may be deposited with a thickness of about 200 Å at a temperature of about 400°–450° C. by the metal-organic chemical vapor deposition (MOCVD) process. Thereby, the layer 22 is formed as an amorphous phase. Further, there is provided a strained superlattice layer 23 on the GaAs layer 22 as the layer for interrupting the propagation of dislocations. It should be noted that there are numerous dislocations 25-1, 25-2 created at the interface between the silicon substrate 21 and the GaAs layer 23. The strained superlattice layer 23 may comprise an alternating repetition of a GaAs layer and an InGaAs layer each having a thickness of about 100 Å. Thereby, a lateral strain acting parallel to the major plane of the layer 23 is developed, and the dislocations 25-1 propagating upwards from the interface between the substrate 21 and the GaAs layer 22 are interrupted or deflected in a direction parallel to the major plane.

On the superlattice layer 23, there is provided a GaAs layer 24 on which an active semiconductor device not illustrated is formed. This layer may be provided by the MOCVD process with a thickness of about 1–1.5 || m at about 700° C. Upon the growth of the layer 24, the amorphous GaAs layer provided previously as the amorphous phase is crystallized. With the strained superlattice layer 23 provided underneath, the GaAs layer 24 has a reduced dislocation density.

In the conventional structure, however, there has been a problem in that the dislocation density that can be achieved is limited in the order of $10^7 cm^{-2}$ or more. Some of the dislocations 25-2 penetrate through the strained superlattice layer 23. This value of $10^7 cm^{-2}$ is not satisfactory for the semiconductor layer on which the active semiconductor devices are formed. As the semiconductor layer for the active layer of semiconductor devices, the layer 24 is generally required to have the dislocation density of $106 cm^{-2}$ or less.

SUMMARY OF THE INVENTION

Accordingly, it is a general object of the present invention to provide a novel and useful semiconductor device wherein the aforementioned problems are eliminated.

Another object of the present invention is to provide a semiconductor device constructed on a compound semiconductor layer, wherein the compound semiconductor layer is provided on a semiconductor layer of another semiconductor material with an intervening structure for interrupting propagation of dislocations.

Another object of the present invention is to provide a semiconductor device constructed on a substrate, said substrate comprising a compound semiconductor layer having the zinc blended structure provided on an elemental semiconductor layer having the diamond structure, with a structure for interrupting propagation of dislocations being provided on the compound semiconductor layer as a part of the substrate to cover the upper surface of the compound semiconductor layer, wherein the structure for interrupting dislocations comprises a layer that induces a stress field acting parallel to the upper surface of the compound semiconductor layer, and wherein the structure is further segmented laterally into a number of regions each having a lattice constant that is different from the lattice constant of adjacent regions so that there is formed a stress field acting perpendicular to the upper surface of the compound semiconductor layer. On the structure, a compound semiconductor layer is grown epitaxially to provide an active layer for the semiconductor device. According to the present invention, the dislocations created at the interface between the elemental semiconductor layer and the compound semiconductor layer and propagating toward the active layer of the semiconductor device, are effectively interrupted by the structure that is not only stressed in the direction parallel to the upper surface of the compound semiconductor layer but also in the direction perpendicular thereto. Thereby, a significant reduction in the dislocation density that cannot be achieved hitherto by the conventional structure can be achieved.

Other objects and further features of the present invention will become apparent from the following detailed description when read in conjunction with the attached drawings.

BRIEF DESCRIPTION OF THE DRAWINGS

FIG. 5 is a diagram showing the effect of the present invention achieved by the structure of FIG. 3.

DETAILED DESCRIPTION

First, the concept of the present invention will be described with reference to FIG. 2 that shows a first embodiment of the present invention.

Figure 2:
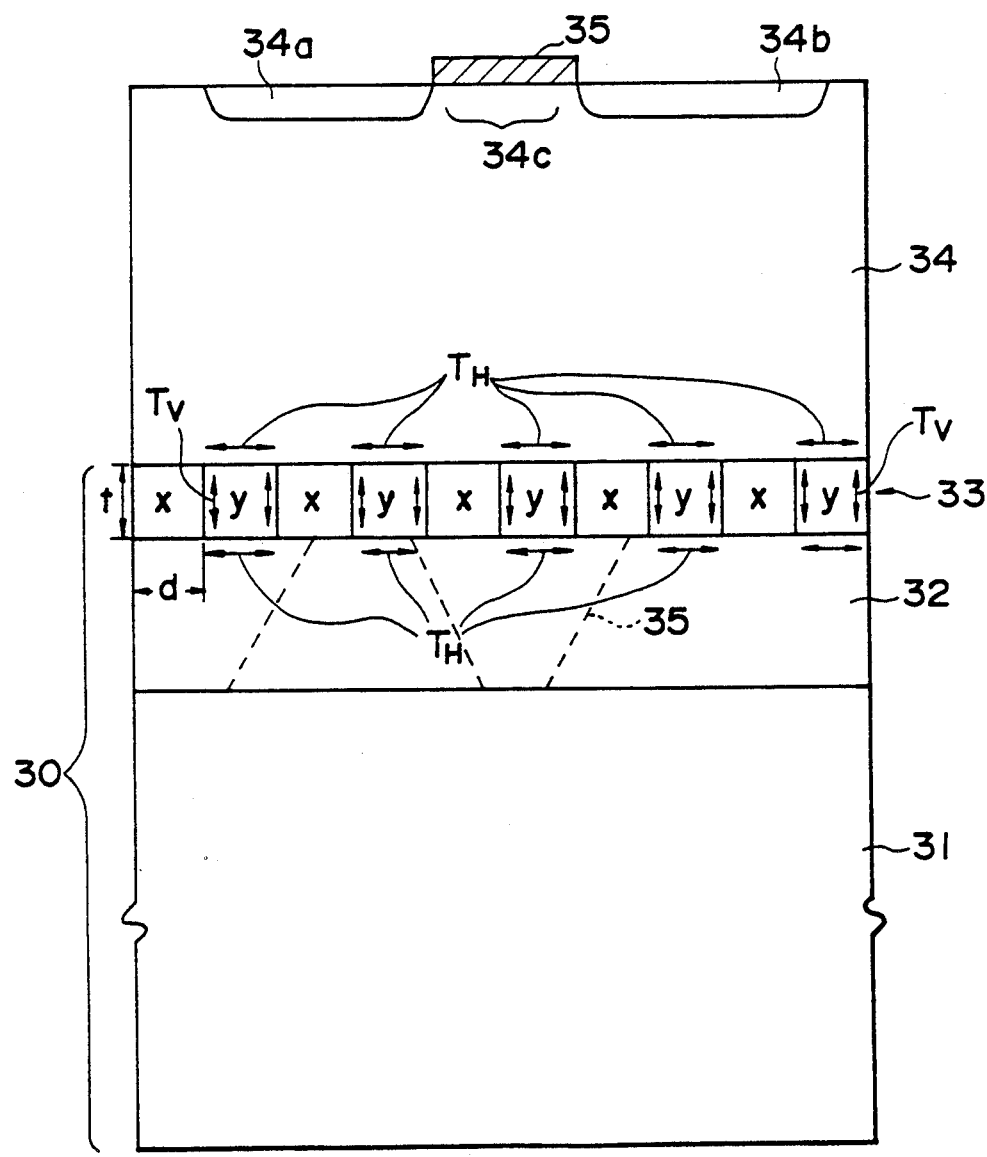
FIG. 2 is a diagram showing a first embodiment of the present invention.

Referring to FIG. 2, the semiconductor device is a metal-semiconductor field effect transistor (MESFET) and comprises a substrate 30 having a structure to be described. On the substrate 30, there is provided a compound semiconductor layer 34, and diffusion regions 34a and 34b are formed in the compound semiconductor layer 34 as usual with an intervening channel region 34c defined theretetween. Further, a tungsten silicide electrode is provided on the top surface of the compound semiconductor layer in correspondence to the channel region 34c. It should be noted, however, that the present invention is by no means limited to the MESFET devices but can be applicable to any other devices that is formed on a compound semiconductor layer.

The substrate 30 comprises a silicon layer 31 that may be produced by the well established process as a silicon wafer. On the silicon layer 31, a layer 32 of GaAs is grown heteroepitaxially according to the two-step process described previously. As already explained, a number of dislocations 35 are created at the interface between the silicon layer 31 and the compound semiconductor layer 32 and propagate through the GaAs layer 32.

On the top surface of the layer 32, there is provided a strained superlattice layer 33 that forms the essential part of the present invention. As illustrated schematically, the strained super lattice layer 33 is divided laterally into a number of regions extending in the direction perpendicular to the plane of the drawing, wherein the regions designated as x, referred to hereinafter as x-region, comprises GaAs and the regions designated as y, referred to hereinafter as y-region, comprises InGaAs. The x-region and the y-region are repeated alternately along the surface of the layer 32. Each x- or y-region typically has a thickness t of about 100 Å and the layer 32 thus has a thickness of 100–500 Å. Further, each x- or y-region has a lateral dimension d of about 50–100 Å.

As InGaAs has a lattice constant that is larger than the lattice constant of GaAs, the y-region thus formed in the strained super lattice layer 33 experiences a compressional stress filed induced by the surrounding GaAs including the underlying and overlying GaAs layers 32 and 34 as well as the adjacent GaAs x-region. Thereby, not only the lateral stress filed TH acting parallel to the major surface of the layer 33 but also the vertical stress field TV is developed in the y-region. Of course, such stress fields induce corresponding stress fields acting in the opposing directions in the adjacent GaAs layers.

When there is a dislocation 35 incident to the strained superlattice layer 33, the discrepancy in the lattice associated with the dislocation is neutralized by the induced stress field in the layer 33 and thereby the propagation of the dislocation is stopped or deflected. In the present invention, the stress field induced in the strained superlattice layer 33 is not only acting in the horizontal direction as in the conventional structure explained with reference to FIG. 1 but also in the vertical direction, and the chance that the dislocation is interrupted is substantially increased. Thereby, the dislocation density in the compound semiconductor layer 34 that is used as the active layer of the semiconductor device, is substantially decreased and the device characteristic is significantly improved.

Next, a second embodiment of the present invention will be described. In this embodiment, too, a MESFET device is provided on the compound semiconductor layer 34 that is grown on the substrate 30 as the semiconductor device, and the description for this part will be omitted. Again, the semiconductor device is not limited to the MESFET device.

Figure 3:
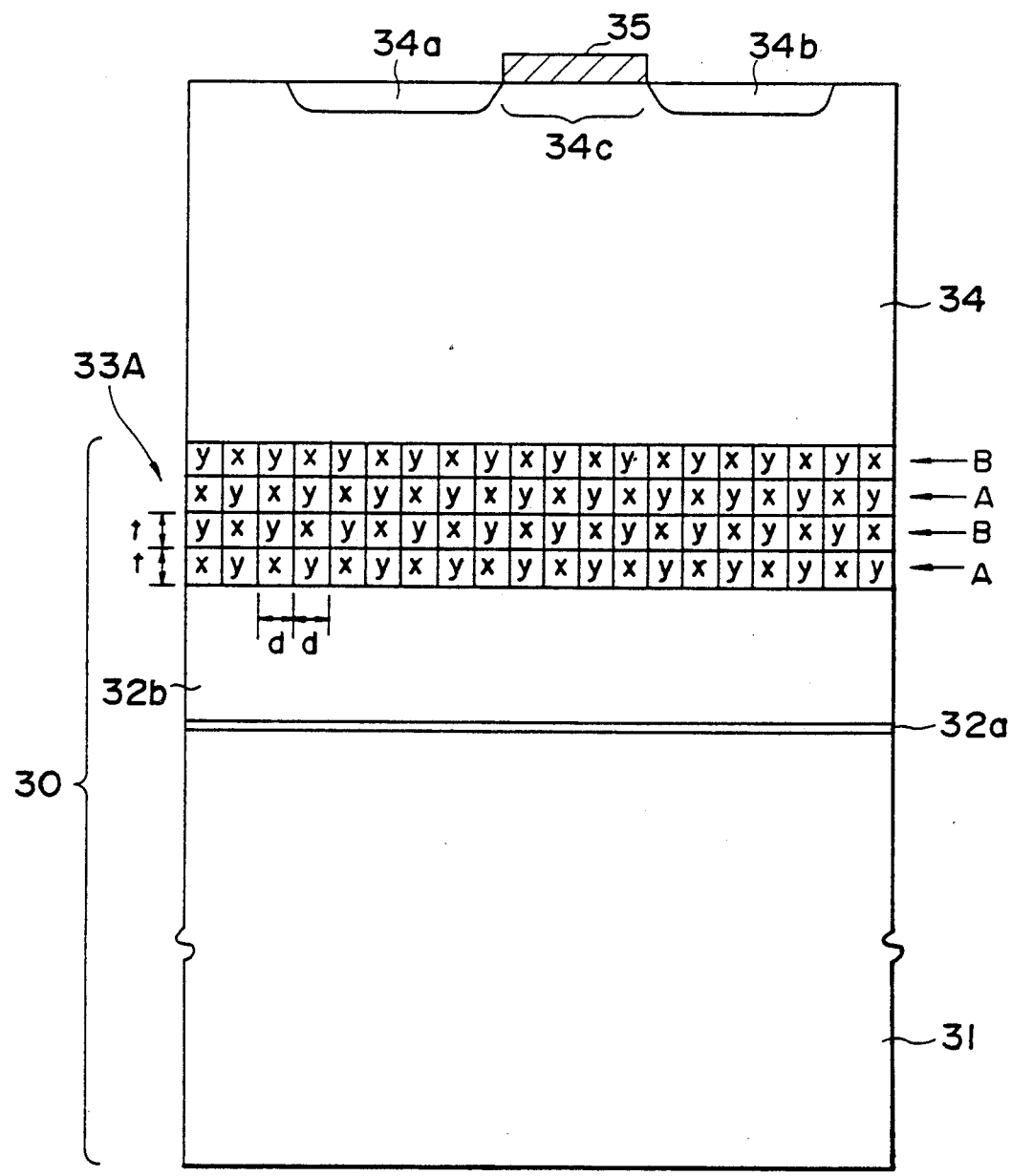
FIG. 3 is a diagram showing a second embodiment of the present invention.

In the present embodiment, the GaAs layer 32 of FIG. 3 is formed of a first thin GaAs layer 32a that is formed in the first step of the two-step growth process and another GaAs layer 32b that is formed in the second step. Thus, the layer 32a is formed as an amorphous phase at the beginning and is crystallized later upon deposition of GaAs layer 32b. The layer 32a may have a thickness of about 100–1000 Å and the layer 32b may typically have a thickness of 0.5–2 μm.

On the layer 32b, a strained superlattice layer 33A is provided, wherein the layer 33A comprises an alternating stacking of layers A and B each having a structure identical with the structure of the layer 33 of FIG. 2. The only difference between the layer A and the layer B is that the phase of repetition of the x-region and the y-region in the layer B is shifted to that of the layer A such that the x-region in the layer B locates immediately above the y-region in the layer A and the y-region in the layer B locates immediately above the x-region in the layer A. Each of the layers A and B has the thickness t of 100–500 Å and the width d of 50–100 Å similarly to the case of the first embodiment. Further, a layer unit comprising the layers A and B is repeatedly stacked for several times to an overall thickness of the layer 33A of about 800–1000 Å such that there is formed a structure having a criss-cross pattern when viewed in the cross-sectional view of FIG. 3. In the cross-section of FIG. 3, each of the regions x and y extends parallel in the direction perpendicular to the plane of the drawing.

In this structure, the stress field TV acting in the vertical direction can be repeatedly induced as desired by repeating the layers A and B in the strained superlattice structure. Thereby, one can eliminate the dislocations efficiently and a dislocation density that is suited for the fabrication of active semiconductor devices is obtained in the GaAs layer 34 grown on the structure 33A.

Figure 4:
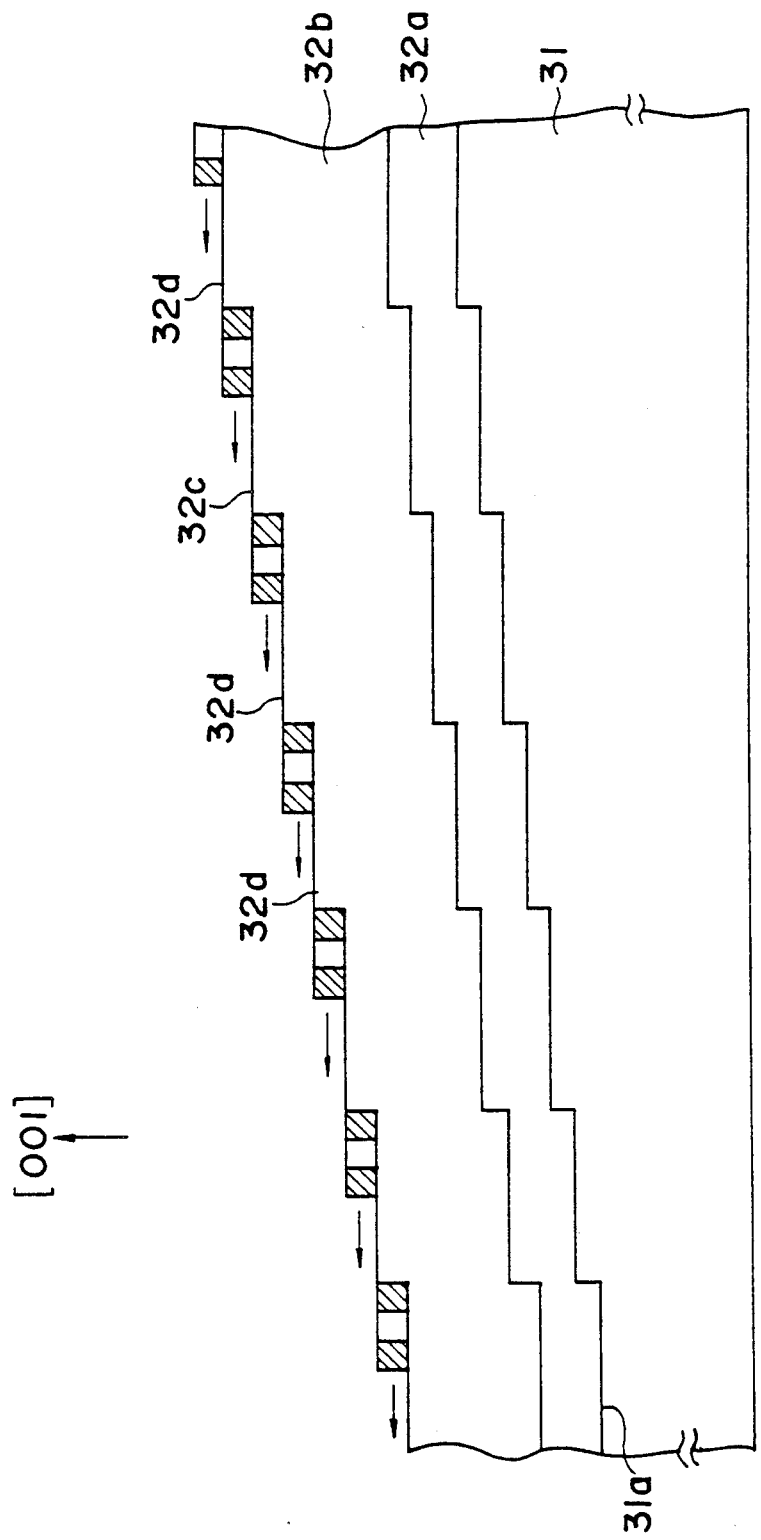
FIG. 4 is a diagram showing a fabrication process of the substrate that is used in the structure of FIG. 3.
Figure 6:
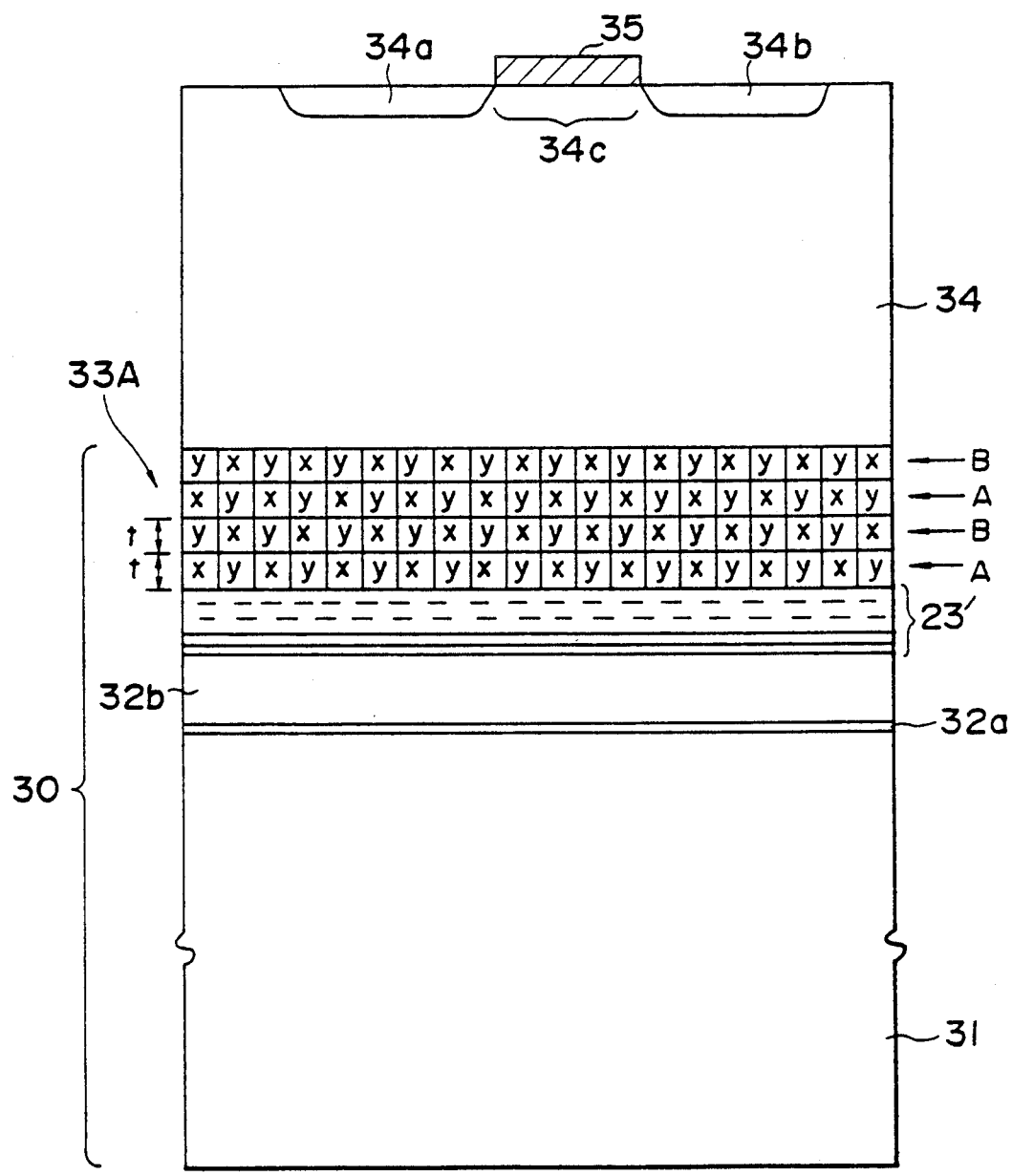
FIG. 6 is a diagram showing a third embodiment of the present invention.

FIG. 4 shows a process employed for realizing the structure of FIG. 2 or FIG. 3.

Referring to FIG. 4, a silicon substrate that has an inclined surface is employed for the fabrication of the substrate 30. More specifically, a silicon substrate having a (001) oriented surface 31a is prepared as the silicon layer 31 such that the surface 31a has an inclination angle of 2 degrees in the [110] direction. As a result of the inclination angle, there appears a stepped surface 31a in the silicon layer 31, and the stepped structure of the surface 31a is transferred to the GaAs layer 32a that is deposited on the surface 31a by the MOCVD process at 450° C. in correspondence to the first step of the two-step heteroepitaxial growth process.

Further, the GaAs layer 32b is deposited on the layer 32a by the MOCVD process at 600°–800° C. in correspondence to the second step of the two-step process. In this step, too, the stepped structure of the surface 31a of the silicon layer 31 is transferred to a surface 32c of the GaAs layer 32. During the deposition of the layer 32b on the layer 32a, the layer 32a crystallizes and there is actually no visual boundary at the interface between the layer 32a and the layer 32b after the deposition of the layer 32b. It should be noted that the surface 32c is thereby characterized by a number of steps 32d extending in the direction perpendicular to the plane of FIG. 4. In the foregoing MOCVD process, arsine (AsH3) and TMG (trimethylgallium) are used as the source gas of GaAs.

Next, the x-region is shown from the edge of each step 32d by the atomic layer epitaxy process by alternately supplying arsine and TMG while holding the temperature at 600°–700 C. Thereby, Ga and As atoms are deposited atomic layer by atomic layer at each step 32d, and the step 32d is moved toward the left in the drawing with the growth of the x-region. In other words, the x-region is grown, starting from the step 32d and extends along the (001) surface of GaAs toward the direction of the arrow as shown in FIG. 4.

When the x-region has grown for the size d of 50–100 Å, the sequence of gas supply is changed, wherein arsine and a mixture of TMG and TMI (trimethylindium) are supplied alternately to the surface of the structure thus obtained while holding the temperature at 600°–700° C. Thereby, the y-region is grown along the (100) surface of GaAs in the direction of the arrow of FIG. 4 with the size d of about 50–100 Å, starting from the edge of the step that is now located at the edge of the x-region. Further, the foregoing steps of growing the x-region and the y-region is repeated alternately until the entire area of each step 32d is covered completely. Thereby, the structure of the strained superlattice layer 33 of FIG. 2 is obtained. Alternatively, it may be considered that the lowermost layer A of FIG. 3 is formed. It should be noted that the layer 33 of FIG. 2 actually have a stepped upper surface in correspondence to the stepped upper surface of the silicon layer 31.

Further, the foregoing process of growing the x- and y-regions is continued such that the y-region is formed on the x-region and the x-region is formed on the y-region. Thereby, the layer B is formed on the lowermost layer A. Further, by repeating the foregoing processes, the strained superlattice structure 33A is obtained wherein the layers A and B are stacked alternately.

On the structure 33A, the GaAs layer 34 is deposited by the usual MOCVD process carried out at a temperature of 650°–800° C. with the thickness of 1–3 μm. It should be noted that the upper surface of the structure 33A has a stepped structure that corresponds to the stepped structure of the inclined, upper surface of the silicon layer 31. On the layer 34, the gate electrode 35 is provided in correspondence to the channel region 34c and the diffusion regions 34a and 34b are formed in the layer 34 at both sides of the electrode 35.

FIG. 5 shows the dislocation density observed for the layer 34 as a function of various number of repetitions of the unit layer (each unit layer consists of one layer A and one layer B) in the strained superlattice layer 33A. In the case of the zero repetition indicating that there is no strained superlattice layer, a value of dislocation density exceeding $10^7$ cm$^{-2}$ was observed With the provision of the structure 33A including therein the layers A and B each repeated two times, the value of dislocation density is decreased below $10^7$ cm$^{-2}$ but still exceeds $10^6$ cm$^{-2}$. When each of the layers A and B is repeated for four times, the value of dislocation density is decreased below $10^6$ cm$^{-2}$ that provides a mark value that the layer 34 can be used as the active layer of the semiconductor device.

Thus, there exists a clear relationship between the number of repetition of the layer A or layer B in the structure 33A and the decrease in the dislocation density in the GaAs layer 34 that is grown on the structure 33A. In other words, the structure of the strained superlattice layer 33A as disclosed in the present invention is effective in decreasing the dislocations from the compound semiconductor layer grown thereabove. By increasing the number of repetitions of the layers A and the layers B further, a further decrease in the dislocation density can be achieved. When the dislocation density is decreased, the recombination of the carriers or other undesirable processes occurring associated with the dislocations is reduced and the device characteristics of the semiconductor device constructed on the GaAs layer 34 is significantly improved.

Figure 1:
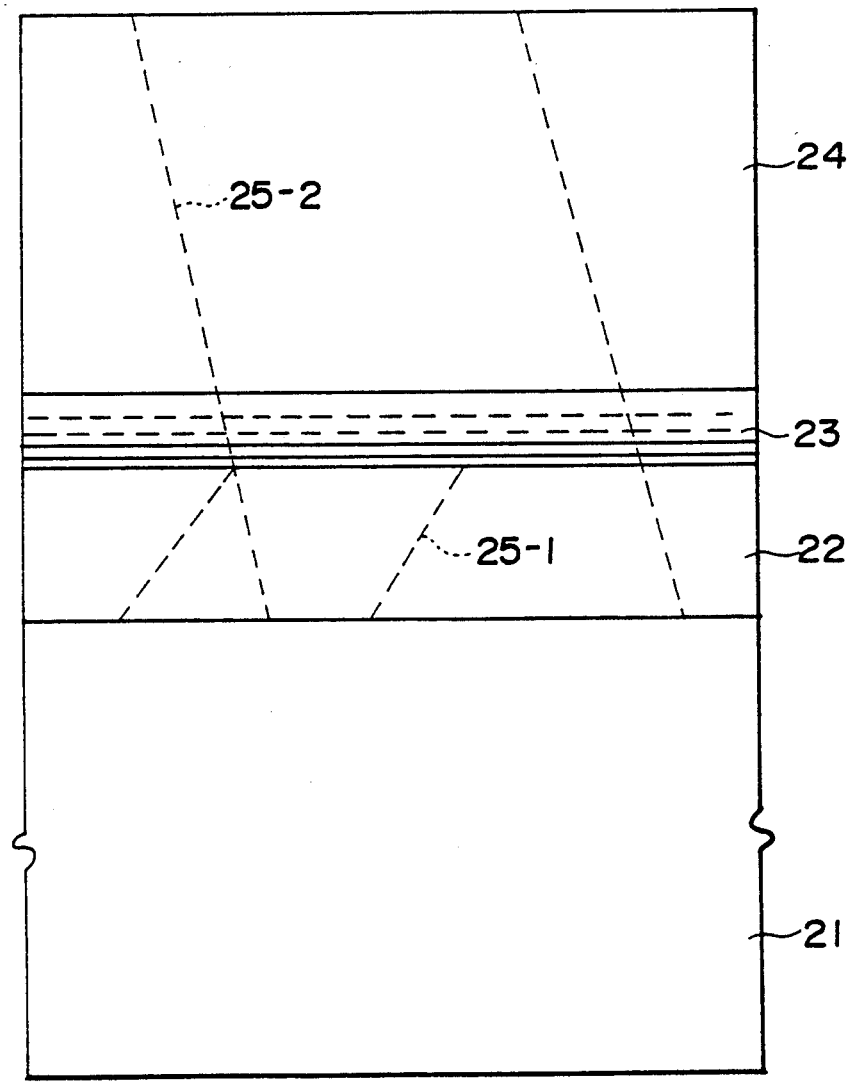
FIG. 1 is a diagram showing a structure of a semiconductor device that is constructed on a heteroepitaxial substrate having a conventional dislocation interrupting structure.

FIG. 5 shows a third embodiment of the present invention wherein a conventional strained superlattice layer 23, having the construction identical with that of the layer 23 of FIG. 1 is interposed between the layer 32b and the layer 33A. In this structure, a considerable proportion of the dislocations is interrupted by the strained superlattice layer 23, before reaching the strained superlattice layer 33A. Thereby, the strained superlattice layer 33A interrupts the dislocations that have survived, and the dislocation density in the layer 34 is further decreased.

Further, the present invention is not limited to the embodiments described heretofore, but various variations and modifications may be made without departing from the scope of the invention.

What is claimed is:

1. A semiconductor device comprising:

a substrate having an upper major surface, said substrate comprising:

a first semiconductor layer having an upper major surface and a lower major surface and comprising a first semiconductor material, a second semiconductor layer having an upper major surface and a lower major surface and provided on the upper major surface of the first semiconductor layer, said second semiconductor layer comprising a second semiconductor material that is different from the first semiconductor material, and a third semiconductor layer having an upper major surface and a lower major surface and provided on the upper major surface of the second semiconductor layer, said third semiconductor layer comprising a plurality of segments each defined by a pair of side walls that extend substantially perpendicular to the lower major surface of the third semiconductor layer, said plurality of segments comprising a plurality of first-type segments of a first material and a plurality of second-type segments of a second material wherein said first- and second-type segments are arranged alternately, when viewed in a direction parallel to the lower major surface of the third semiconductor layer, such that each first-type segment shares a first side wall with a neighboring second-type segment and a second side wall opposing the first side wall with another neighboring second-type segment that opposes the first mentioned second-type segment, and such that each second-type segment shares a first side wall with a neighboring first-type segment and a second side wall opposing the first side wall with another neighboring first-type segment that opposes the first mentioned first-type segment, said first and second materials having respective lattice constants that differ with each other such that a stress field acting substantially perpendicular to the lower major surface of the third semiconductor layer is induced at each side wall of the first and second segments;

a fourth semiconductor layer having an upper major surface and a lower major surface and provided on the upper major surface of said substrate; and an active region formed at least in the fourth semiconductor layer.

2. A semiconductor device as claimed in claim 1, in which said upper major surface of the third semiconductor layer coincides with the upper major surface of said substrate.

3. A semiconductor device as claimed in claim 1, in which said first semiconductor material has a diamond-type crystal structure and said second semiconductor material has a zinc blende-type crystal structure.

4. A semiconductor device as claimed in claim 3, in which said first material forming the first-type segments and said second material forming the second-type segments both have the zinc blende-type crystal structure.

5. A semiconductor device as claimed in claim 4, in which said first material is identical with the second semiconductor material.

6. A semiconductor device as claimed in claim 1, in which said first semiconductor material comprises silicon, said second semiconductor material comprises gallium arsenide, said first material of the third semiconductor layer comprises gallium arsenide and said second material of the third semiconductor layer comprises indium gallium arsenide.

7. A semiconductor device as claimed in claim 1, in which said fourth semiconductor layer comprises a material having a zinc blende-type crystal structure.

8. A semiconductor device as claimed in claim 7, in which said fourth semiconductor layer comprises gallium arsenide.

9. A semiconductor device as claimed in claim 1, in which said first-type segment and said second-type segment have a size of 50–100 Å when measured in the direction parallel to the lower major surface of the third semiconductor layer.

10. A semiconductor device as claimed in claim 1, in which said first-type segments and said second-type segments of the third semiconductor layer form a plurality of layers each defined by an upper major surface and a lower major surface and stacked each other in the third semiconductor layer such that, in each layer, the first-type segment and the second-type segment are arranged alternately when viewed in the direction parallel to the lower major surface of the third semiconductor layer and such that the first-type segment and the second-type segment are repeated alternately when viewed in a direction perpendicular to the lower major surface of the third semiconductor layer.

11. A semiconductor layer as claimed in claim 10, in which each of said plurality of layers formed in the third semiconductor layer has a thickness of 100–500 Å.

12. A semiconductor layer as claimed in claim 10, in which a pair of said plurality of layers; formed in the third semiconductor layer and stacked adjacent each other, forms a unit layer, and said unit layer is repeated in the direction perpendicular to the lower major surface of the third semiconductor layer for at least four times.

* * * * *

UNITED STATES PATENT AND TRADEMARK OFFICE
CERTIFICATE OF CORRECTION

PATENT NO. : 5,057,880

DATED : October 15, 1991

INVENTOR(S) : Eshita et al.

It is certified that error appears in the above-identified patent and that said Letters Patent is hereby corrected as shown below:

Col. 1, line 48, begin a new paragraph with "STEP(1);
line 50, begin a new paragraph with "STEP(2)";

Col. 2, line 36, "∥m" should be --$\mu$m--;
line 52, "106 cm$^{-2}$" should be --$10^6$ cm$^{-2}$--;
line 68, "blended" should be --blende--.

Col. 3, line 48, after "DESCRIPTION" insert --OF THE PREFERRED EMBODIMENTS--.

Col. 6, line 5, "is" should be --are--.

Col. 7, line 1, "23," should be --23'--;
line 11, "device" should be --device,--.

Col. 8, line 30, "segment" should be --segments--;
line 31, "segment" should be --segments--;
line 38, after "stacked" insert --adjacent--;
line 40, "segment" (both occurrences) should be --segments--;
line 51, "layers;" should be --layers--;
line 53, "other," should be --other--.

Signed and Sealed this

Twenty-third Day of February, 1993

*Attest:*

STEPHEN G. KUNIN

*Attesting Officer*   Acting Commissioner of Patents and Trademarks